US012626768B2

(12) United States Patent
Jung et al.

(10) Patent No.: US 12,626,768 B2
(45) Date of Patent: May 12, 2026

(54) MEMORY DEVICE FOR EFFECTIVELY PERFORMING BIT LINE PRECHARGE OPERATION AND OPERATION METHOD OF THE SAME

(71) Applicant: SK hynix Inc., Gyeonggi-do (KR)

(72) Inventors: Jae Yeop Jung, Gyeonggi-do (KR); Dong Hun Kwak, Gyeonggi-do (KR); Se Chun Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 208 days.

(21) Appl. No.: 18/504,154

(22) Filed: Nov. 8, 2023

(65) Prior Publication Data

US 2024/0428864 A1 Dec. 26, 2024

(30) Foreign Application Priority Data

Jun. 23, 2023 (KR) ........................ 10-2023-0081017

(51) Int. Cl.
| | |
|---|---|
| *G11C 16/24* | (2006.01) |
| *G11C 16/10* | (2006.01) |
| *G11C 16/26* | (2006.01) |
| *G11C 16/34* | (2006.01) |
| *G11C 8/14* | (2006.01) |
| *G11C 11/56* | (2006.01) |
| *G11C 16/04* | (2006.01) |
| *G11C 16/08* | (2006.01) |
| *G11C 16/30* | (2006.01) |
| *G11C 16/32* | (2006.01) |

(52) U.S. Cl.
CPC .............. *G11C 16/24* (2013.01); *G11C 16/10* (2013.01); *G11C 16/26* (2013.01); *G11C 16/3459* (2013.01); *G11C 8/14* (2013.01);

*G11C 11/5628* (2013.01); *G11C 16/0483* (2013.01); *G11C 16/08* (2013.01); *G11C 16/30* (2013.01); *G11C 16/32* (2013.01)

(58) Field of Classification Search
CPC ......... G11C 16/24; G11C 16/10; G11C 16/26; G11C 16/3459; G11C 11/5628; G11C 16/0483; G11C 16/08; G11C 16/32; G11C 16/30; G11C 8/14
See application file for complete search history.

(56) References Cited

U.S. PATENT DOCUMENTS

| | | | |
|---|---|---|---|
| 10,984,872 B1 | 4/2021 | Jin | |
| 2015/0103595 A1* | 4/2015 | Dunga | ................... G11C 16/24 |
| | | | 365/185.21 |

FOREIGN PATENT DOCUMENTS

KR 10-2021-0012822 A 2/2021

* cited by examiner

*Primary Examiner* — Alexander Sofocleous
*Assistant Examiner* — Joseph Fidelis Stormes
(74) *Attorney, Agent, or Firm* — IP & T GROUP LLP

(57) ABSTRACT

A memory device, comprising: a memory cell array including a plurality of memory cell strings, and coupled between a plurality of bit lines and a plurality of word lines, the bit lines commonly coupled to a common source line, and a control portion suitable for: precharging the bit lines to a first level during a read operation for selected memory cells coupled to a selected word line of the word lines, and precharging the bit lines to a second level during a verify operation of a program operation for the selected memory cells, wherein the second level is lower than the first level by a set level.

18 Claims, 11 Drawing Sheets

MEMORY DEVICE FOR EFFECTIVELY PERFORMING BIT LINE PRECHARGE OPERATION AND OPERATION METHOD OF THE SAME

CROSS-REFERENCE TO RELATED APPLICATIONS

The present application claims priority of Korean Patent Application No. 10-2023-0081017, filed on Jun. 23, 2023, which is incorporated herein by reference in its entirety.

BACKGROUND

1. Field

Various embodiments of the present invention relate to a semiconductor memory device, and more particularly, to a memory device for effectively performing a bit line precharge operation, and a method for operating the memory device.

2. Description of the Related Art

Memory systems are storage devices embodied using a semiconductor such as silicon (Si), germanium (Ge), gallium arsenide (GaAs), indium phosphide (InP), or the like. The memory systems are classified into a volatile memory device and a nonvolatile memory device. The volatile memory device is a memory device in which data stored therein is lost when power supply is interrupted. Representative examples of the volatile memory device include static RAM (SRAM), dynamic RAM (DRAM), synchronous DRAM (SDRAM), etc. The nonvolatile memory device is a memory device in which data stored therein is retained even when power supply is interrupted. Representative examples of the nonvolatile memory device include a read only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc. Flash memories are chiefly classified into a NOR-type memory and NAND-type memory.

A program operation for the multiple memory cells that are included in a nonvolatile memory device may be performed by repeating a program loop including a voltage application operation and a verify operation. Here, the voltage application operation may be an operation of changing the threshold voltages of memory cells selected as a program target, while applying a program pulse, having a voltage increased step by step, to a word line to which the memory cells selected as the program target have been connected.

Furthermore, the verify operation may be an operation of checking whether threshold voltage levels of the memory cells selected as the program target have reached a target voltage level.

Furthermore, a read operation for the multiple memory cells that are included in a nonvolatile memory device may be an operation of sensing whether threshold voltage levels of the memory cells selected as the read target have reached a read voltage level.

SUMMARY

Embodiments of the present invention are directed to a memory device capable of varying a bit line precharge level according to whether a requested operation is a verify operation or a read operation included in a program operation, and a method for operating the memory device.

The technical problems desired to be achieved by the embodiments of the present invention are not limited to the technical problems mentioned above, and other technical problems not mentioned above may also be clearly understood by those of ordinary skill in the art to which the present invention pertains from the description below.

In accordance with an embodiment of the present invention, a memory device may include: a memory cell array including a plurality of memory cell strings, and coupled between a plurality of bit lines and a plurality of word lines, the bit lines commonly coupled to a common source line; and a control portion suitable for: precharging the bit lines to a first level during a read operation for selected memory cells coupled to a selected word line of the word lines, and precharging the bit lines to a second level during a verify operation of a program operation for the selected memory cells, wherein the second level is lower than the first level by a set level.

In accordance with another embodiment of the present invention, a method for operating a memory device including a memory cell array having a plurality of memory cell strings, and coupled between a plurality of bit lines and a plurality of word lines, the method may include: precharging the bit lines to a first level during a read operation for selected memory cells included in cell strings coupled to a selected word line of the word lines; and precharging the bit lines to a second level during a verify operation of a program operation for the selected memory cells, wherein the second level is lower than the first level by a set level.

In accordance with another embodiment of the present invention, an operating method of a memory device, the operating method may include: lowering, during a verify operation in a program operation on a row of memory cells, a precharge level of bit lines by an amount from the precharge level for a read operation on the row; increasing the amount as the row is disposed closer to a common source line and/or as a number of program loops increases during the program operation; and increasing, in proportion to the amount, a level of a verification voltage applied to the row.

BRIEF DESCRIPTION OF THE DRAWINGS

FIG. 7 is a block diagram illustrating an example of a control portion among the constituent elements of the memory device shown in FIG. 1 in accordance with an embodiment of the present invention.

DETAILED DESCRIPTION

Figure 1:
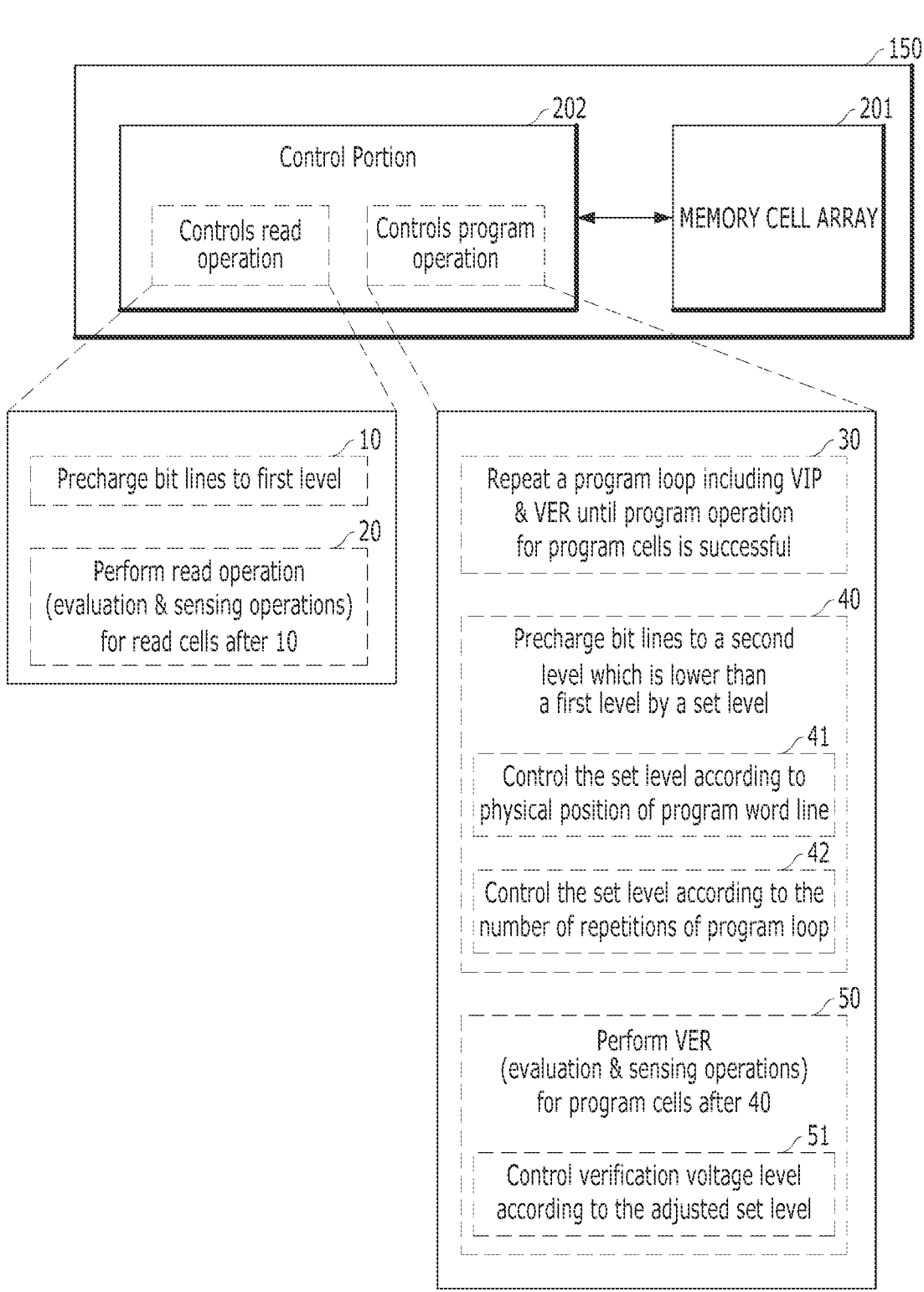
FIG. 1 is a block diagram illustrating a memory device in accordance with an embodiment of the present invention.

Various embodiments of the present disclosure are described below with reference to the accompanying drawings. Elements and features of this disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components (e.g., an interface unit, circuitry, etc.).

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational (e.g., is not turned on nor activated). The block/unit/circuit/component used with the "configured to" language includes hardware, for example, circuits, memory storing program instructions executable to implement the operation, etc. Additionally, "configured to" can include a generic structure (e.g., generic circuitry) that is manipulated by software and/or firmware (e.g., an FPGA or a general-purpose processor executing software) to operate in a manner that is capable of performing the task(s) at issue. "Configured to" may also include adapting a manufacturing process (e.g., a semiconductor fabrication facility) to fabricate devices (e.g., integrated circuits) that implement or perform one or more tasks.

As used in this disclosure, the term 'circuitry' or 'logic' refers to all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor(s)/software (including digital signal processor(s)), software, and memory (ies) that work together to cause an apparatus, such as a mobile phone or server, to perform various functions and (c) circuits, such as a microprocessor(s) or a portion of a microprocessor(s), that require software or firmware for operation, even if the software or firmware is not physically present. This definition of 'circuitry' or 'logic' applies to all uses of this term in this application, including in any claims. As a further example, as used in this application, the term "circuitry" or "logic" also covers an implementation of merely a processor (or multiple processors) or a portion of a processor and its (or their) accompanying software and/or firmware. The term "circuitry" or "logic" also covers, for example, and if applicable to a particular claim element, an integrated circuit for a storage device.

As used herein, the terms "first," "second," "third," and so on are used as labels for nouns that the terms precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. For example, the phrase "determine A based on B." While in this case, B is a factor that affects the determination of A, such a phrase does not foreclose the determination of A from also being based on C. In other instances, A may be determined based solely on B.

Herein, an item of data, a data item, a data entry or an entry of data may be a sequence of bits. For example, the data item may include the contents of a file, a portion of the file, a page in memory, an object in an object-oriented program, a digital message, a digital scanned image, a part of a video or audio signal, metadata or any other entity which can be represented by a sequence of bits. According to an embodiment, the data item may include a discrete object. According to another embodiment, the data item may include a unit of information within a transmission packet between two different components.

FIG. 1 is a block diagram illustrating a memory device in accordance with an embodiment of the present invention.

Figure 2A:
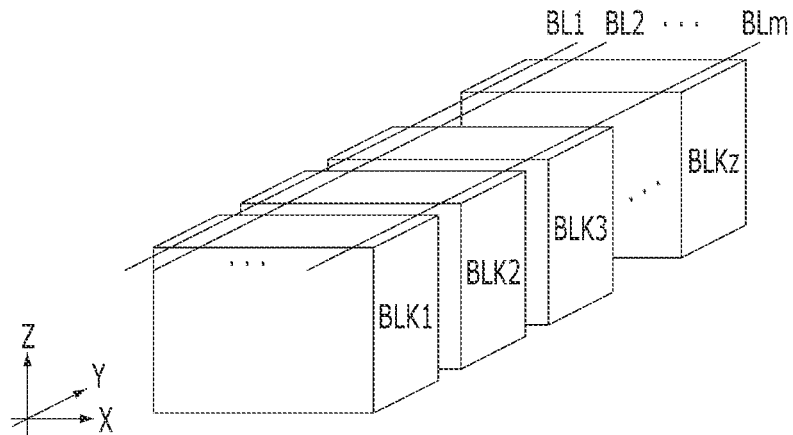
FIGS. 2A and 2B illustrate a structure of a memory cell array among the constituent elements of the memory device shown in FIG. 1 in accordance with an embodiment of the present invention.
Figure 2B:
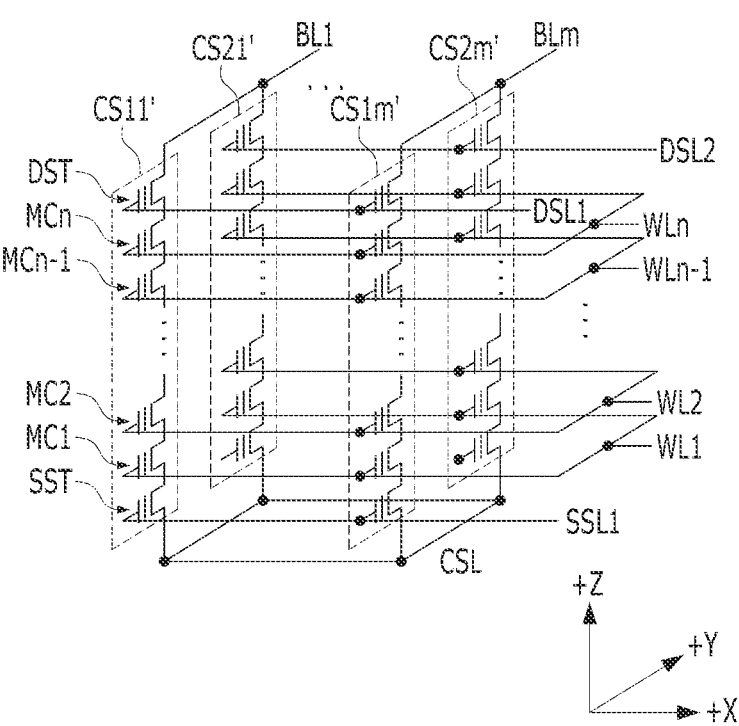

FIGS. 2A and 2B illustrate a structure of a memory cell array among the constituent elements of the memory device shown in FIG. 1 in accordance with the embodiment of the present invention.

Figure 3A:
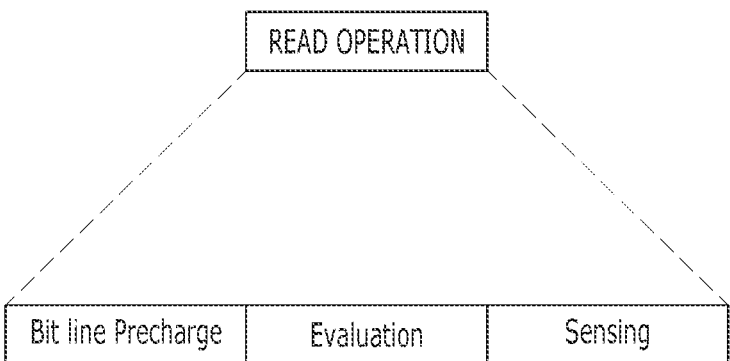
FIGS. 3A to 3C illustrate a difference between a bit line precharge voltage level of a read operation and a bit line precharge voltage level of a verify operation in the memory device shown in FIG. 1 in accordance with an embodiment of the present invention.
Figure 3B:
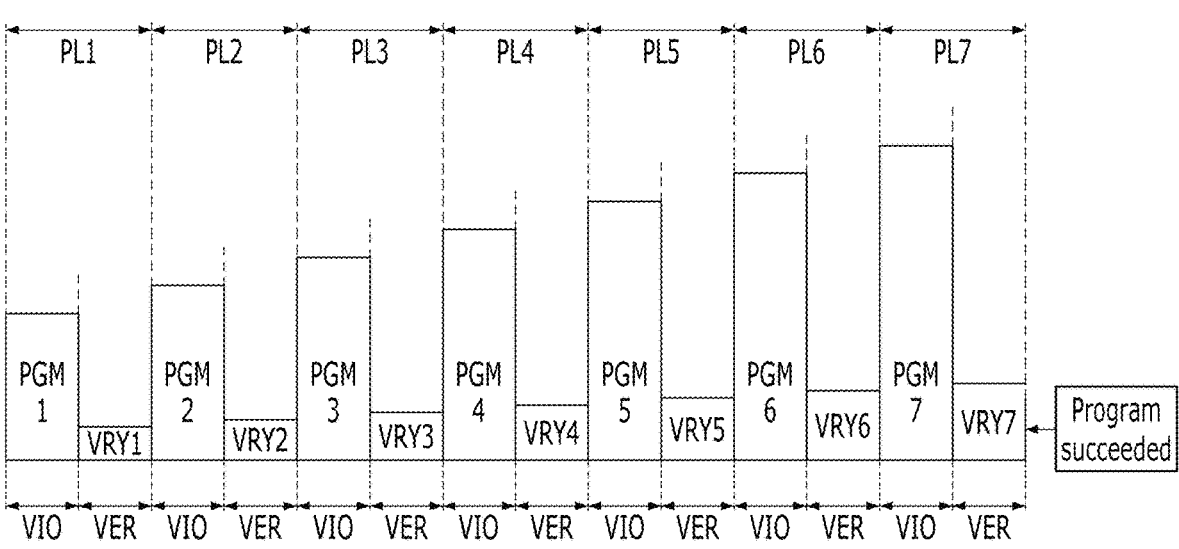
Figure 3B:
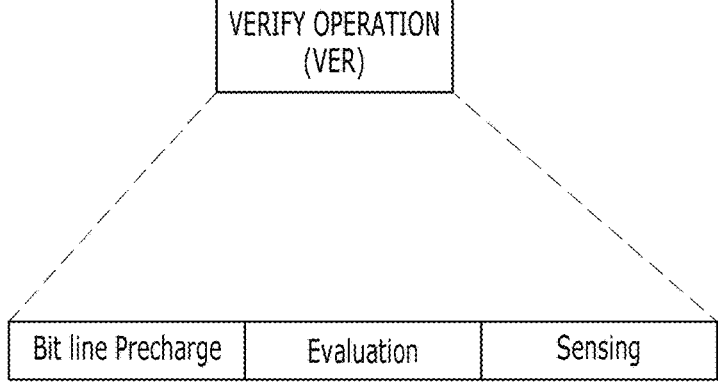
Figure 3C:
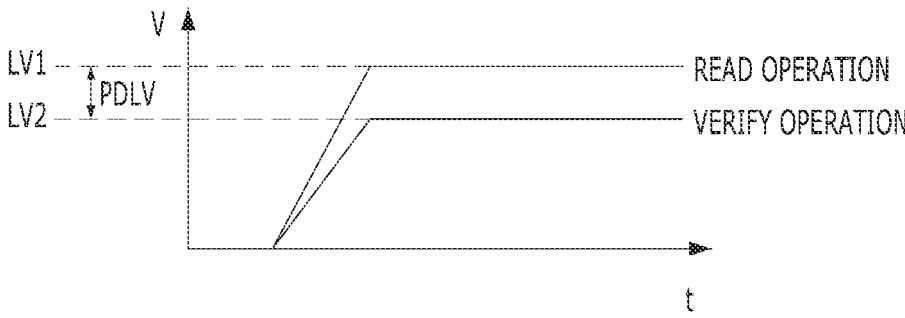

FIGS. 3A to 3C illustrate a difference between a bit line precharge voltage level of a read operation and a bit line precharge voltage level of a verify operation in the memory device shown in FIG. 1 in accordance with the embodiment of the present invention.

Referring to FIG. 1 together with FIGS. 2A and 2B, a memory device 150 according to an embodiment of the present disclosure may include a memory cell array 201 and a controller 202.

The memory cell array 201 may include a plurality of memory blocks BLK<1: z>. Each of the memory blocks BLK<one of 1:z> may include a plurality of memory cells (not illustrated). One memory block may include a plurality of pages.

The memory blocks may be understood to be a group of non-volatile memory cells from which data are removed together through the erase operation. Each of the memory blocks BLK<one of 1:z> may include a page (not illustrated) in which the non-volatile memory cells are grouped, from a logical point of view, such as storing of data together during the program operation or outputting of data together during the read operation. For example, one memory block may include a plurality of pages. One page may include a plurality of non-volatile memory cells.

From a physical point of view different from the logical point of view such as the program operation or the read operation, one memory block may include a plurality of word lines WL<1:n>. One word line may include a plurality of non-volatile memory cells.

In this case, one word line may correspond to at least one page according to the number of bits that can be stored or expressed in one non-volatile memory cell. For example, when one non-volatile memory cell is a single level cell (SLC) storing one data bit, one word line may correspond to one page. When one non-volatile memory cell is a double level cell (DLC) storing two data bits, one word line may correspond to two pages. When one non-volatile memory cell is a triple level cell (TLC) storing three data bits, one word line may correspond to three pages. When one non-volatile memory cell is a quadruple level cell (QLC) storing four data bits, one word line may correspond to four pages. In this way, when one non-volatile memory cell is a multiple level cell storing five or more data bits, one word line may correspond to five or more pages.

Each of the memory blocks BLK<one of 1:z> may include a 3-D structure. For example, each of the memory blocks BLK<one of 1:z> may include multiple memory cells that are stacked on a substrate. Accordingly, each of the memory blocks may be arranged in a +X direction, a +Y direction, and a +Z direction.

More specifically, each of the memory blocks may include multiple memory cells that are connected among multiple word lines WL<1: n> that are arranged in a Z direction, multiple bit lines BL<1:m> that are arranged in an X direction, and multiple memory cell strings CS<11': 1m', 21': 2m'> that are arranged in X and Y directions.

Herein, each of a plurality of memory cell strings CS<11': 1m', 21': 2m'> may include at least one source selection transistor SST and first to nth memory cells MC<1: n> and at least one drain selection transistor DST.

Herein, each of the selection transistors SST and DST and the memory cells MC<1: n> may have a similar structure. According to an embodiment of the present invention, each of the selection transistor SST and DST and the memory cells MC<1: n> may include a channel layer, a tunneling dielectric layer, a charge storage layer, and a blocking dielectric layer. According to another embodiment of the present invention, a pillar for providing a channel layer may be provided in each cell string. According to yet another embodiment of the present invention, a pillar for providing at least one of a channel layer, a tunneling dielectric layer, a charge storage layer, and a blocking dielectric layer may be provided to each cell string.

The source selection transistor SST included in each of the memory cell strings CS<11': 1m', 21': 2m'> may be coupled between a common source line CSL and a memory cell MC<1: n>.

According to an embodiment of the present invention, source selection transistors of the cell strings that are arranged in the same row may be coupled to a source selection line extending in a row direction, and the source selection transistors of the cell strings that are arranged in different rows may be coupled to different source selection lines. In the drawing, the source selection transistor of each of the cell strings CS<11': 1m'> in a first row may be coupled to a first source selection line SSL1. Also, the source selection transistor of each of the cell strings CS<21': 2m'> of the second row may be coupled to a second source selection line SSL2.

According to another embodiment of the present invention, the source selection transistors of the cell strings CS<11': 1m'> and CS<21': 2m'> may be commonly coupled to one source selection line, unlike those shown in the drawing.

The first to nth memory cells MC<1: n> included in each of the memory cell strings CS<11': 1m', 21': 2m'> may be coupled between a source selection transistor SST and a drain selection transistor DST.

The drain selection transistor DST included in each of the memory cell strings CS<11': 1m', 21': 2m'> may be coupled between a corresponding bit line and a memory cell MC<1: n>. Cell strings arranged in the row direction may be coupled to a drain selection line extending in the row direction. The drain selection transistor of the cell string CS<11': 1m'> of the first row may be coupled to a first drain selection line DSL1. The drain selection transistor of the cell string CS<21': 2m'> of the second row may be coupled to a second drain selection line DSL2.

Cell strings arranged in a column direction may be coupled to a bit line extending in the column direction. In the drawing, the cell strings CS11' and CS21' of a first column may be coupled to a first bit line BL1. The cell strings CS1*m'* and CS2*m'* of an m-th column may be coupled to the m-th bit line BLm.

Memory cells coupled to a word line in the cell strings that are arranged in the row direction may form one physical page. For example, the memory cells coupled to a first word line WL1 among the cell strings CS<11': 1m'> of the first row may form one physical page. For another example, the memory cells coupled to the first word line WL1 among the cell strings CS<21': 2m'> of the second row may form another physical page. Cell strings arranged in one row direction may be selected by selecting one of the drain selection lines DSL1 and DSL2. One physical page of the selected cell strings may be selected by selecting one of the word lines WL<1: n>.

According to an embodiment of the present invention, at least one of the first to nth memory cells MC<1: n> may be used as a dummy memory cell. For example, the at least one or more dummy memory cells may be provided to reduce an electric field between the source selection transistor SST and the memory cell MC<1: n>. Also, the at least one or more dummy memory cells may be provided to reduce an electric field between the drain selection transistor DST and the memory cell MC<1: n>. As more dummy memory cells are provided, the size of a memory block may be increased while the operation reliability of the memory block is improved. As less memory cells are provided, the operation reliability of the memory block may be deteriorated while the size of the memory block is decreased.

To efficiently control the at least one or more dummy memory cells, each of the dummy memory cells may have a required threshold voltage. Program operations may be performed on all or some of the dummy memory cells before or after an erase operation on the memory block. When an erase operation is performed after a program operation, each of the dummy memory cells may have a required threshold voltage by controlling the voltage applied to a dummy word line that is coupled to the dummy memory cells.

The control unit 202 may control a read operation of reading data stored (programmed) in a selected area of the memory cell array 201. The control unit 202 may perform a read operation on selected memory cells (which are hereinafter referred to as 'read cells') included in selected cell strings of the cell strings CS<11': 1m', 21': 2m'>. The selected memory cells may be coupled to a word line selected as a read target among a plurality of word lines WL<1: n>.

To be more specific, referring to FIG. 3A, the read operation READ OPERATION may include a bit line precharge operation BIT LINE PRECHARGE, an evaluation operation EVALUATION, and a sensing operation SENSING.

Herein, the bit line precharge operation BIT LINE PRECHARGE may be an operation of applying a precharge voltage to the bit lines BL<1:m>. In the bit line precharge operation BIT LINE PRECHARGE, the voltage level of the bit lines BL<1:m> may rise to the level of the precharge voltage.

In particular, the control unit 202 according to an embodiment of the present invention may apply a precharge voltage having a first level to the bit lines BL<1:m> in a bit-line precharge operation BIT LINE PRECHARGE included in a read operation READ OPERATION. The control unit 202 according to an embodiment of the present invention may precharge the bit lines BL<1:m> to the level in the bit-line precharge operation BIT LINE PRECHARGE included in the read operation READ OPERATION (see 10 in FIG. 1).

Also, an evaluation operation EVALUATION may be an operation of applying the state of the read cells to the bit lines BL<1:m>. For example, since they have a threshold voltage level which is lower than a read voltage level, the level of the bit line corresponding to the read cells that are turned on in the evaluation operation EVALUATION may fall from the level of a precharge voltage applied through the bit line precharge operation BIT LINE PRECHARGE to the level of a ground voltage. For another example, since they have a threshold voltage level which is higher than the read voltage level, the level of the bit line corresponding to the read cells that are turned off in the evaluation operation EVALUATION may be maintained as it is at the level of the precharge voltage applied through the bit line precharge operation BIT LINE PRECHARGE.

Also, a sensing operation SENSING may be an operation of sensing data corresponding to the state of the read cells applied to the bit lines BL<1:m> through the evaluation operation EVALUATION and storing the sensed data in a page buffer.

To sum up, the control unit 202 according to an embodiment of the present invention may perform an evaluation operation EVALUATION and a sensing operation SENSING on the bit lines BL<1:m> precharged to the first level through a bit line precharge operation BIT LINE PRECHARGE during a read operation READ OPERATION (see 20 in FIG. 1).

Also, the control unit 202 may control a program operation of programming data in a selected region of the memory cell array 201. The control unit 202 may perform a program operation on the selected memory cells (which are, hereinafter, referred to as 'program cells') included in selected cell strings of the cell strings CS<11': 1m', 21': 2m'>. The selected memory cells may be coupled to a word line (which is, hereinafter, referred to as a 'program word line') that is selected as a program target among a plurality of word lines WL<1: n>. Herein, the program cells may have one program state among a plurality of program states through a program operation.

According to an embodiment of the present invention, a single level cell SLC in which one data bit is stored may have two program states that are distinguished based on one threshold voltage level. A multi-level cell MLC in which two data bits are stored may have four program states that are distinguished based on three threshold voltage levels. A triple level cell TLC in which three data bits are stored may have eight program states that are distinguished based on seven threshold voltage levels. A quad level cell QLC in which four data bits are stored may have 16 program states that are distinguished based on 15 threshold voltage levels.

Referring to FIG. 3B together with FIG. 1, a program operation may include a plurality of program loops PL1 to PL7. The control unit 202 may program the program cells to have one program state among a plurality of program states (see 30 in FIG. 1) by repeatedly running a plurality of program loops PL1 to PL7 one by one in a predetermined order until the program operation is completed. Herein, if the program operation has not succeeded within a predetermined number of program loops, the control unit 202 may determine the program operation to be a failure.

According to an embodiment of the present invention, in FIG. 3B, the program operation is successfully performed at a moment when the seventh program loop PL7 among the program loops PL1 to PL7 is completed. In FIG. 3B, the program cells have a target program state at a moment when the seventh program loop PL7 among the program loops PL1 to PL7 is completed.

Herein, each of the program loops PL1 to PL7 may include a voltage application operation VIO for changing the threshold voltage level of the program cells by applying a program pulse PGM<1:7> to the program word line; and a verify operation VER for verifying which program state the program cells are in by applying a verifying voltage VRY<1: 7> corresponding to a target level to the program word line.

Also, whenever each of the program loops PL1 to PL7 is performed, the potential level of the program pulse may increase. The program operation may increase the level of the program voltage according to the Increment Step Pulse Program (ISPP) method as each of the program loops PL1 to PL7 is repeatedly performed. In this case, the number of times that the program voltage used in each of the program loops PL1 to PL7 is applied, the level of the program voltage, and the length of the time that the program voltage is applied may be determined in diverse forms.

Also, a verify operation VERIFY OPERATION included in each of program loops PL1 to PL7 may include a bit line precharge operation BIT LINE PRECHARGE, an evaluation operation EVALUATION, and a sensing operation SENSING.

Herein, the bit line precharge operation BIT LINE PRECHARGE may be an operation of applying a precharge voltage to the bit lines BL<1:m>. The bit line precharge operation BIT LINE PRECHARGE included in the verify operation VER during a program operation may be an operation which is substantially the same as the bit line precharge operation BIT LINE PRECHARGE included in the read operation READ OPERATION described above.

However, further referring to FIG. 3C, the control unit 202 according to an embodiment of the present invention may apply a precharge voltage having a second level LV2 which is lower than the first level LV1 by a set level PDLV to the bit lines BL<1:m> in the bit-line precharge operation BIT LINE PRECHARGE included in a verify operation VER during a program operation. The control unit 202 according to an embodiment of the present invention may precharge the bit lines BL<1:m> to the first Level LV1 in the bit-line precharge operation BIT LINE PRECHARGE included in a read operation READ OPERATION, but it may precharge the bit lines BL<1:m> to a second level LV2 which is lower than the first Level LV1 by the set level PDLV in the bit line precharge operation BIT LINE PRE-CHARGE included in a verify operation VER during a program operation (see 40 in FIG. 1).

Also, the evaluation operation EVALUATION may be an operation of applying the state of the program cells to the bit lines BL<1:m>. For example, since it has a threshold voltage level which is lower than the level of the verification voltage VRY<1:7>, the level of the bit line corresponding to the program cells that are turned on in the evaluation operation EVALUATION may drop from the level of the precharge voltage applied through the bit line precharge operation BIT LINE PRECHARGE to the level of the ground voltage. For another example, since they have a threshold voltage level which is higher than the level of the verification voltage VRY<1:7>, the level of the bit line corresponding to the program cells that are turned off in the evaluation operation EVALUATION may maintain the level of the precharge voltage applied through the bit-line precharge operation BIT LINE PRECHARGE as it is.

Also, the sensing operation SENSING may be an operation of sensing the data corresponding to the state of the program cells applied to the bit lines BL<1:m> through an evaluation operation EVALUATION and storing the sensed data in the page buffer.

To sum up, the control unit 202 according to an embodiment of the present invention may perform an evaluation operation and a sensing operation on the bit lines BL<1:m> which is precharged to the second level LV2 through the bit-line precharge operation BIT LINE PRECHARGE during a verify operation VER of a program operation (see 50 in FIG. 1).

Furthermore, the control unit 202 according to an embodiment of the present invention may adjust the set level PDLV indicating the voltage level difference between the first level LV1 and the second level LV2 (see 41 and 42 in FIG. 1). The control unit 202 may adjust the set level PDLV indicating the level difference between the precharge voltage of the first level LV1 used in the bit-line precharge operation BIT LINE PRECHARGE of a read operation READ OPERATION for the read cells and the precharge voltage of the second level LV2 used in the bit-line precharge operation BIT LINE PRECHARGE of a verify operation VER during a program operation for the program cells.

Also, the control unit 202 according to an embodiment of the present invention may adjust the level of the verification voltage VRY<1:7> applied to the program word line in the verify operation VER in response to adjusting the set level PDLV (see 51 in FIG. 1). The control unit 202 may increase, in proportion to an increase in the set level PDLV, the level of the verification voltage VRY<1:7> applied to the program word line during the verify operation VER.

More specific details will be described with reference to FIGS. 4 to 6 below.

Figure 4:
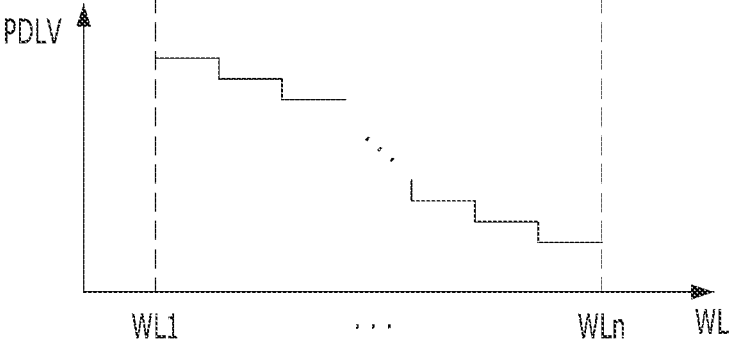
FIG. 4 is a graph illustrating an operation of varying the difference between the bit line precharge voltage level of a read operation and the bit line precharge voltage level of a verify operation in the memory device shown in FIG. 1 in accordance with an embodiment of the present invention according to a physical position of a word line which is selected as a program target.

FIG. 4 is a graph illustrating an operation of varying the difference between the bit line precharge voltage level of a read operation and the bit line precharge voltage level of a verify operation in the memory device shown in FIG. 1 in accordance with an embodiment of the present invention according to a physical position of a word line which is selected as a program target.

Referring to FIG. 4 together with FIG. 1, the control unit 202 according to an embodiment of the present invention may adjust the set level PDLV representing a voltage level difference between the first level LV1 and the second level LV2 according to the physical position of the program word line (see 41 in FIG. 1). In this case, the physical position of the program word line may mean how physically close it is to a common source line CSL.

According to an embodiment of the present invention, it may be seen that a first word line WL1 among the word lines WL<1: n> as illustrated in FIG. 2B is a word line that is physically closer to the common source line CSL than to a second word line WL2. In this case, the control unit 202 may set the set level PDLV corresponding to the selection of the first word line WL1 as the program word line to be relatively greater than the set level PDLV corresponding to the selection of the second word line WL2 as the program word line as illustrated in FIG. 4. That is, the control unit 202 may adjust the set level PDLV by increasing the set level PDLV as the selected word line is positioned closer to the common source line CSL.

According to another embodiment of the present invention, as illustrated in FIG. 2B, it may be seen that a $(n-1)^{th}$ word line WLn-1 among the word lines WL<1: n> is a word line that is physically closer to the common source line CSL than a $n^{th}$ word line WLn. In this case, as illustrated in FIG. 4, the control unit 202 may set the set level PDLV corresponding to the selection of the $(n-1)^{th}$ word line WLn-1 as the program word line to be relatively greater than the set level PDLV corresponding to the selection of the $n^{th}$ word line WLn as the program word line, as illustrated in FIG. 4.

To sum up, as the control unit 202 selects a word line physically closer to the common source line CSL as the program word line, the level PDLV representing the voltage level difference between the first level LV1 and the second level LV2 may be increased.

Figure 5:
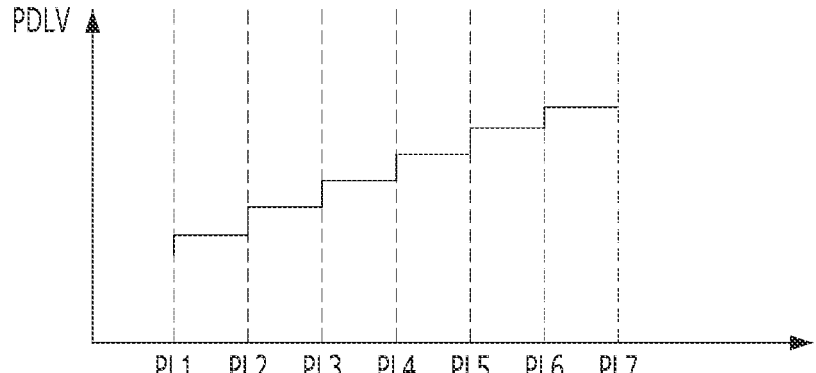
FIG. 5 is a graph illustrating an operation of varying the difference between the bit line precharge voltage level of a read operation and the bit line precharge voltage level of a verify operation in the memory device shown in FIG. 1 in accordance with an embodiment of the present invention according to the number of repetitions of a program loop.

FIG. 5 is a graph illustrating an operation of varying the difference between the bit line precharge voltage level of a read operation and the bit line precharge voltage level of a verify operation in the memory device shown in FIG. 1 in accordance with an embodiment of the present invention according to the number of repetitions of a program loop.

Referring to FIG. 5 together with FIG. 1, the control unit 202 according to an embodiment of the present invention may adjust the set level PDLV representing the voltage level difference between the first level LV1 and the second level LV2 according to which program loop the bit line precharge operation BIT LINE PRECHARGE of a verify operation VER is included in among a plurality of program loops PL1 to PL7 included in a program operation (see 42 in FIG. 1). The control unit 202 may adjust the set level PDLV representing the voltage level difference between the first level LV1 and the second level LV2 according to the number of repetitions of the program loop (see 42 in FIG. 1).

According to an embodiment of the present invention, the control unit 202, as illustrated in FIG. 5, may set the set level PDLV in the bit line precharge operation BIT LINE PRE-CHARGE of a verify operation VER included in the first program loop PL1 among the program loops PL1 to PL7 to be relatively greater than the set level PDLV in the bit line precharge operation BIT LINE PRECHARGE of a verify operation VER included in the second program loop PL2. That is, the control unit 202 may adjust the set level PDLV further according to a number of repetitions of the program loop.

According to another embodiment of the present invention, the control unit 202, as illustrated in FIG. 5, may set the set level PDLV in the bit line precharge operation BIT LINE PRECHARGE of a verify operation VER included in a third program loop PL3 among the program loops PL1 to PL7 to be relatively greater than the set level PDLV in the bit line precharge operation BIT LINE PRECHARGE of a verify operation VER included in a fourth program loop PL4.

To sum up, the control unit 202 may increase the set level PDLV representing the voltage level difference between the first level LV1 and the second level LV2 in proportion to the increase in the number of repetitions of a program loop.

Figure 6:
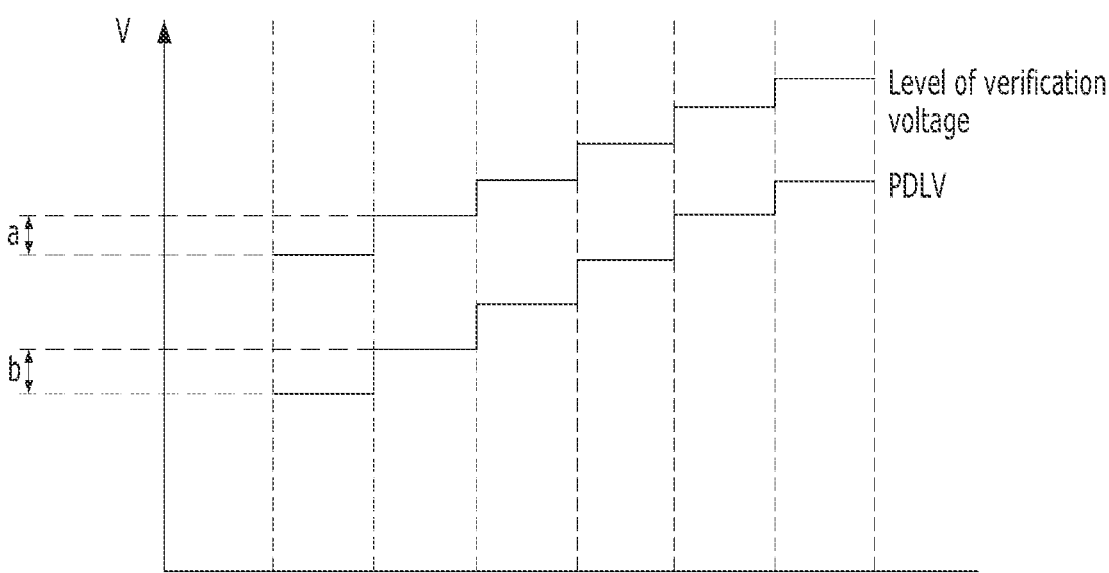
FIG. 6 is a graph illustrating an operation of adjusting the level of a verification voltage in a verify operation according to the operation of varying the difference between the bit line precharge voltage level of a read operation and the bit line precharge voltage level of a verify operation in the memory device shown in FIG. 1 in accordance with an embodiment of the present invention.

FIG. 6 is a graph illustrating an operation of adjusting the level of a verification voltage in a verify operation according to the operation of varying the difference between the bit line precharge voltage level of a read operation and the bit line precharge voltage level of a verify operation in the memory device shown in FIG. 1 in accordance with an embodiment of the present invention.

Referring to FIG. 6 together with FIG. 1, the control unit 202 according to an embodiment of the present invention may adjust the level of the verification voltage VRY<1:7> applied to a program word line in a verify operation VER in response to the adjustment of the set level PDLV indicating the voltage level difference between the first level LV1 and the second level LV2 (see 51 in FIG. 1). The control unit 202 may adjust the level of the verification voltage VRY<1:7> applied to the program word line in a verify operation VER in response to the adjustment of the set level PDLV that is set in the methods of 41 and 42, which are described in FIGS. 4 and 5.

According to the embodiment of the present invention, the control unit 202, as illustrated in FIG. 6, may increase the level of the verification voltage VRY<1:7> by 'a' in proportion to the increase of the set level PDLV representing the voltage level difference between the first level LV1 and the second level LV2 by 'b'. Herein, 'a', which is the level increment of the verification voltage VRY<1:7>, may mean increasing the level of the verification voltage VRY<1:7> corresponding to a target level of the program cells as much as 'a' additionally.

For example, when the target level of the program cells is 'k' in the verify operation VER, the level of the verification voltage VRY<1:7> for verifying this may be 'k'. When the target level of the program cells is 'k' and the set level PDLV is increased by 'b' in the verify operation VER, the control unit 202 may change the level of the verification voltage VRY<1:7> to 'k+a', which is increased by 'a' from 'k' and use it in the verify operation VER.

For another example, when the target level of the program cells is 'k' and the set level PDLV is increased by '3b', which is three times as much as 'a', in the verify operation VER, the control unit 202 may change the level of the verification voltage VRY<1:7> to 'k+3a', which is increased from 'k' by three times as much as 'a' and use it in the verify operation VER.

Also, 'a', which is an increment of the level of the verification voltage VRY<1:7>, and 'b', which is an increment of the level of the set level PDLV, may have different values. The value of 'a', the increment of the level of the verification voltage VRY<1:7>, and the value of 'b', the increment of the level of the set level PDLV, may be defined by the designer to be a preset ratio.

To sum up, the control unit 202 may increase the level of the verification voltage VRY<1:7> level in proportion to increasing the level of the set level PDLV, which is a voltage level difference between the first level LV1 and the second level LV2.

Figure 7:
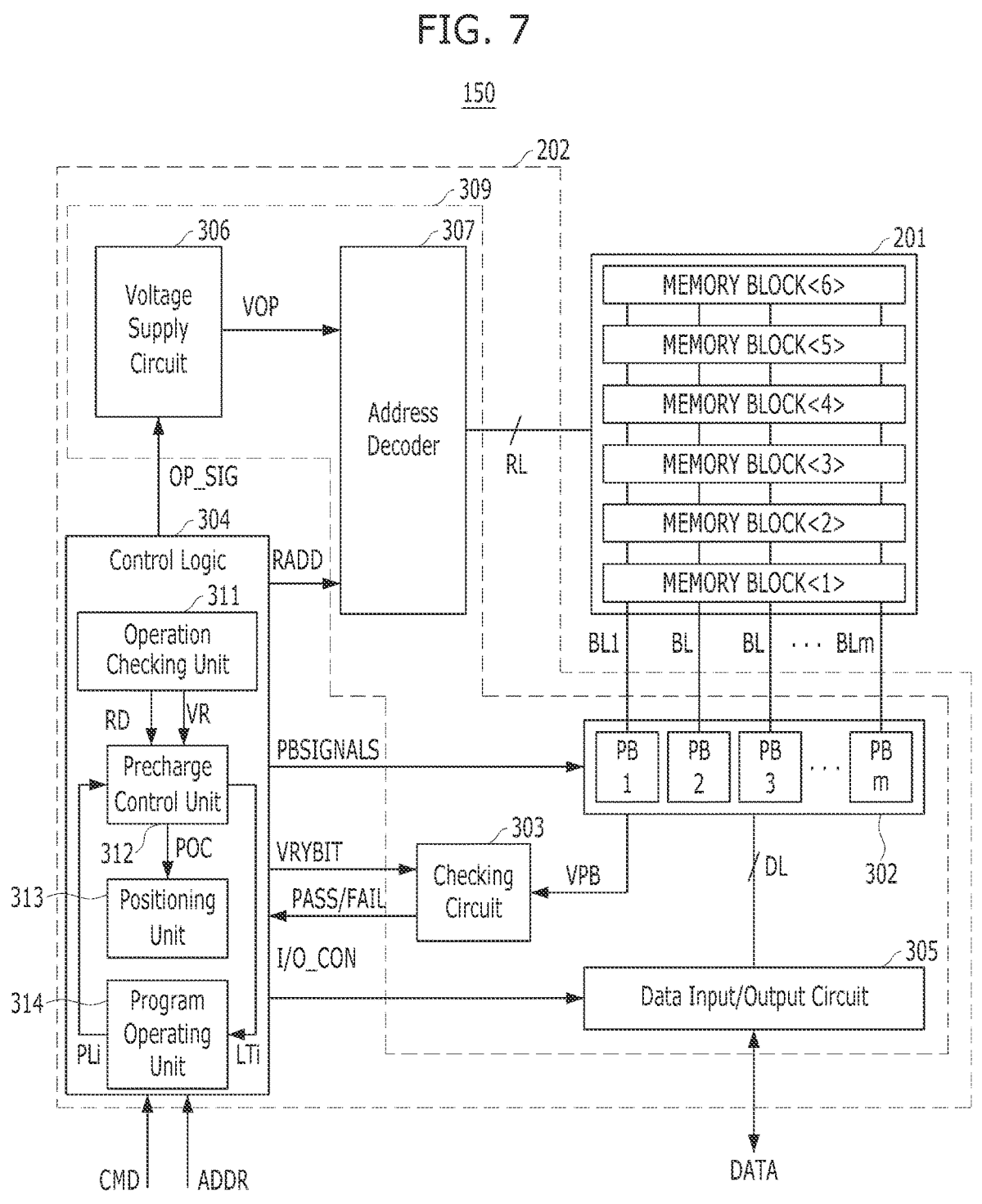

FIG. 7 is a block diagram illustrating an example of a control portion among the constituent elements of the memory device shown in FIG. 1 in accordance with an embodiment of the present invention.

Referring to FIG. 7, the memory device 150 may include a memory cell array 201 and a control unit 202. The control unit 202 may include a control circuit 309 and a control logic 304. The control circuit 309 may include a page buffer 302, a checker 303, a data input/output circuit 305, a voltage supply circuit 306, and an address decoder 307. The control circuit 309 may include an operation checking unit 311, a precharge control unit 312, a positioning unit 313, and a program operating unit 314.

The memory cell array 201 may include a plurality of memory blocks MEMORY BLOCK<1:6>. The plurality of memory blocks MEMORY BLOCK<1:6> may be connected to an address decoder 307 through a row line RL. The plurality of memory blocks MEMORY BLOCK<1:6> may be connected to the page buffer unit 302 through bit lines BL1 to BLm. Each of the memory blocks MEMORY BLOCK<1:6> may include a plurality of memory cells.

Referring to FIG. 7 together with FIG. 2B, the row line RL may include at least one source selection line SSL1, SSL2, a plurality of word lines (WL<1: n>) and at least one drain selection line (DSL1, DSL2).

The control circuit unit 309 may be configured to perform a program, read or erase operation on a selected region of the memory cell array 201. The control circuit unit 309 may drive the memory cell array 201. For example, the control circuit unit 309 may apply various operating voltages to the row line RL and the bit lines BL1 to BLm or discharge the applied voltages. The control circuit 309 may perform a program operation for the program cells in response to the control of the control logic 304. In particular, the control circuit 309 may perform an overwrite-type program operation as well as a normal program operation on the program cells in response to the control of the control logic 304.

The address decoder 307 included in the control circuit unit 309 may be connected to the memory cell array 201 through the row line RL.

The address decoder 307 may be configured to operate in response to the control of the control logic unit 304. The address decoder 307 may receive an address RADD from the control logic unit 304.

The address decoder 307 may be configured to decode a block address of the received address RADD. The address decoder 307 may select at least one memory block among the memory blocks MEMORY BLOCK<1:6> according to the decoded block address. The address decoder 307 may be configured to decode a row address of the received address RADD. The address decoder 307 may select at least one word line among word lines of the selected memory block according to the decoded row address. The address decoder 307 may apply operating voltages Vop, which are supplied from the voltage supply circuit 306, to the selected word line.

The voltage supply circuit 306 among the control circuit unit 309 may be configured to generate a plurality of operating voltages Vop by using an external power supply voltage. The voltage supply circuit 306 may operate in response to the control of the control logic unit 304.

In an embodiment, the voltage supply circuit 306 may regulate the external power supply voltage and generate an internal power supply voltage.

In an embodiment, the voltage supply circuit 306 may generate the plurality of operating voltages Vop by using the external power supply voltage or the internal power supply voltage.

The voltage supply circuit 306 may include a plurality of pumping capacitors, which receive the internal power supply voltage, to generate the plurality of operating voltages Vop having various voltage levels and generate the plurality of operating voltages Vop by selectively activating the plurality of pumping capacitors in response to the control of the control logic unit 304.

The generated operating voltages Vop may be supplied to the memory cell array 201 by the address decoder 307. For example, the voltage supply circuit 306 may adjust the level and supply time of each of the operation voltages Vop in response to the operation signal OP_SIG.

Referring further to FIG. 3B, the voltage supply circuit 306 may generate a program voltage PGM<1:7>, a pass voltage, a verification voltage VRY<1:7>, a read voltage, an erase voltage, and the like as an operation voltage VOP, and supply the generated operation voltage VOP to an address decoder 307. For example, during a program operation, the voltage supply circuit 306 may generate a program voltage, a pass voltage, and a verification voltage as an operation voltage VOP in response to an operation signal OP_SIG and supply the generated operation voltage VOP to the address decoder 307. In this case, the program voltage may be a voltage supplied to the program word line, and the pass voltage may be a voltage supplied to a word line which is not selected as a program target. The voltage supply circuit 306 may control the supply time of each operation voltage VOP according to the operation signal OP_SIG. For example, the voltage supply circuit 306 may adjust output times of the program voltage, pass voltage, and verification voltage according to the operation signal OP_SIG, and output the voltages according to the adjusted output times.

The page buffer unit 302 may include a plurality of page buffers PB1 to PBm. The plurality of page buffers PB1 to PBm may be connected to the memory cell array 201 through the plurality of bit lines BL1 to BLm, respectively. The plurality of page buffers PB1 to PBm may operate in response to the control of the control logic unit 304.

The plurality of page buffers PB1 to PBm may communicate data DATA with the data input/output circuit 157. During the program operation, the plurality of page buffers PB1 to PBm may receive the data DATA to be stored, through the data input/output circuit 157 and a data line DL.

After the start of a program operation, the multiple page buffers PB1 to PBm may store data DATA that is received from the outside through the data input/output circuit 305 and may transmit a program permission voltage or a program inhibition voltage to the bit lines BL1 to BLm in response to the stored data DATA. For example, the program permission voltage may be 0 V, and the program inhibition voltage may be a power supply voltage.

After the start of a read operation, the multiple page buffers PB1 to PBm may sense data DATA based on a voltage or current of the bit lines BL1 to BLm, which is determined based on threshold voltages of the memory cells of a selected page and may transmit the sensed data DATA to the data input/output circuit 305 through the data lines DL.

After the start of an erase operation, the multiple page buffers PB1 to PBm may make the bit lines BL1 to BLm float or may apply a voltage of 0 V to the bit lines BL1 to BLm.

The data input/output circuit 305 may include a plurality of input/output buffers (not illustrated) that receive the data DATA inputted thereto. During the program operation, the data input/output circuit 305 may receive the data DATA to be stored from an external. The data input/output circuit 305 may output the data DATA, which is transmitted from the plurality of page buffers PB1 to PBm included in the page buffer unit 302, to the external during the read operation.

The check unit 303 of the control circuit unit 309 may generate a reference current in response to a verify reference signal VRYBIT that is generated by the control logic unit 304 after the start of a read operation or a verify operation, may compare a sensing voltage VPB that is received from the page buffer group 123 and a reference voltage that is generated from the reference current, and may output a pass signal PASS or a fail signal FAIL to the control logic unit 304. For example, when a level of the sensing voltage VPB is higher than or equal to a level of the reference voltage, the check unit 303 may output the pass signal PASS to the control logic unit 304. When the level of the sensing voltage VPB is lower than the level of the reference voltage, the check unit 303 may output the fail signal FAIL to the control logic unit 304.

The control logic unit 304 may be connected to the address decoder 307, the voltage supply circuit 306, the page buffer unit 302, the data input/output circuit 305, and the check unit 303 that are included in the control circuit unit 309. The control logic unit 304 may be configured to control an overall operation of the memory device 150. The control logic unit 304 may operate in response to a command CMD from an external device.

The control logic unit 304 may control the control circuit unit 309 by generating various signals in response to the command CMD and an address ADDR. For example, the control logic unit 304 may generate an operation signal OPSIG, an address RADD, a read and write control signal PBSIGNALS, and the verify reference signal VRYBIT, in response to the command CMD and the address ADDR. The control logic unit 304 may output the operation signal OPSIG to the voltage supply circuit 306, may output the address RADD to the address decoder 307, may output the read and write control signal PBSIGNALS to the page buffer unit 302, and may output the verify reference signal VRYBIT to the check unit 303. Furthermore, the control logic unit 304 may determine whether a verify operation has passed or failed in response to the pass or fail signal PASS/FAIL that is output by the check unit 303.

To be more specific, the operation checking unit 311 included in the control logic 304 may check what operation is requested from the outside in response to a command CMD applied from the outside.

According to an embodiment of the present invention, the operation checking unit 311 may confirm that the operation requested from the outside is a read operation in response to the command CMD applied from the outside. In this case, the operation checking unit 311 may generate a first output signal RD corresponding to a read operation.

According to another embodiment of the present invention, the operation checking unit 311 may confirm that the operation requested from the outside is a verify operation VER included in a program operation in response to the command CMD applied from the outside. In this case, the operation checking unit 311 may generate a second output signal VR corresponding to a verify operation VER.

Also, the precharge control unit 312 included in the control logic 304 may precharge the bit lines BL<1:m> to one level among the first level LV1 and the second level LV2 which is lower than the first level LV1 by the set level PDLV in response to the output signals RD and VR of the operation checking unit 311. The precharge control unit 312 may control the operation of the control circuit 309 to apply the precharge voltage having one level among the first level LV1 and the second level LV2 which is lower than the first level LV1 by the set level PDLV to the bit lines BL<1:m> in a verify operation VER included in a program operation under the control of the operation checking unit 311.

According to an embodiment of the present invention, the precharge control unit 312 may control the operation of the control circuit 309 to apply the precharge voltage having the first level LV1 to the bit lines BL<1:m> in response to the generation of the first output signal RD corresponding to a read operation in the operation checking unit 311.

According to another embodiment of the present invention, the precharge control unit 312 may control the operation of the control circuit 309 to apply the precharge voltage having the second level LV2 which is lower than the first level LV1 by the set level PDLV to the bit lines BL<1:m> in response to the generation of the second output signal VR corresponding to a verify operation VER included in a program operation in the operation checking unit 311.

Also, the positioning unit 313 included in the control circuit 309 may detect memory cells on which an operation requested from the outside is to be performed in response to an address ADDR applied from the outside, that is, memory cells selected based on a selected word line and a selected memory cell string in the memory cell array 201. Since the selected memory cells may be detected by the positioning unit 313, the physical position of the selected word line may also be detected. The positioning unit 313 may check how far the physical position of the selected word line is from the common source line, and generate a third output signal POC corresponding to the checking result.

When the precharge control unit 312 precharges the bit lines BL<1:m> to the second level in response to the generation of the second output signal VR in the operation checking unit 311, it may adjust the set level PDLV corresponding to the level difference between the first level LV1 and the second level LV2 in response to the third output signal POC generated by the positioning unit 313.

According to an embodiment of the present invention, the positioning unit 313 may determine that the physical position of the first word line WL1 among the word lines WL<1: n> is relatively closer to the common source line than the physical position of the second word line WL2, and may generate the third output signal POC for controlling the precharge control unit 312 such that the set level PDLV adjusted by the precharge control unit 312 in response to the first word line WL1 being selected as the selected word line is relatively greater than the set level PDLV adjusted by the precharge control unit 312 in response to the second word line WL2 being selected as the selected word line as a result of the checking result. That is, the precharge control unit 312 may adjust the set level PDLV by increasing the set level PDLV as the selected word line is positioned closer to the common source line CSL.

According to another embodiment of the present invention, the positioning unit 313 may determine that the physical position of the $(n-1)^{th}$ word line WLn-1 among the word lines WL<1: n> is relatively closer to the common source line than the physical position of the $n^{th}$ word line WLn, and may generate the third output signal POC for controlling the precharge control unit 312 such that the set level PDLV adjusted by the precharge control unit 312 in response to the $(n-1)^{th}$ word line WLn-1 being selected as the selected word line is relatively greater than the set level PDLV adjusted by the precharge control unit 312 in response to the $n^{th}$ word line WLn being selected as the selected word line as a result of the checking result.

The program operating unit 314 included in the control circuit 309 may repeat the program loops PL1 to PL7 including a voltage application operation VIO and a verify operation VER until the program operation for the program cells is performed successfully. Herein, the program operating unit 314 may generate information PLi indicating which program loop is being repeated among the program loops PL1 to PL7 that are repeated for the program cells and transfer the generated information PLi to the precharge control unit 312. When the precharge control unit 312 precharges the bit lines BL<1:m> to the second level in response to the second output signal VR being generated by the operation checking unit 311, it may adjust the set level PDLV corresponding to the level difference between the first level LV1 and the second level LV2 in response to the program loop information PLi transferred from the program operating unit 314.

According to an embodiment of the present invention, the precharge control unit 312 may increase the set level PDLV corresponding to the level difference between the first level LV1 and the second level LV2 in proportion to the increase in the number of repetitions of the program loop transferred from the program operating unit 314. That is, the precharge control unit 312 may adjust the set level PDLV further according to a number of repetitions of the program loop.

Then, the precharge control unit 312 may generate information LTi indicating how much the set level PDLV corresponding to the level difference between the first level LV1 and the second level LV2 is adjusted and transfer the generated information LTi to the program operating unit 314. The program operating unit 314 may adjust the level of the verification voltage VRY<1:7> applied to the program word line in the verify operation VER of a program operation in response to the level adjustment information LTi of the set level PDLV transferred from the precharge control unit 312.

According to an embodiment of the present invention, the program operating unit 314 may increase, in proportion to the increase in the set level PDLV transferred from the precharge control unit 312, the level of the verification voltage VRY<1:7> applied to the program word line in the verify operation VER of the program operation.

Figure 8:
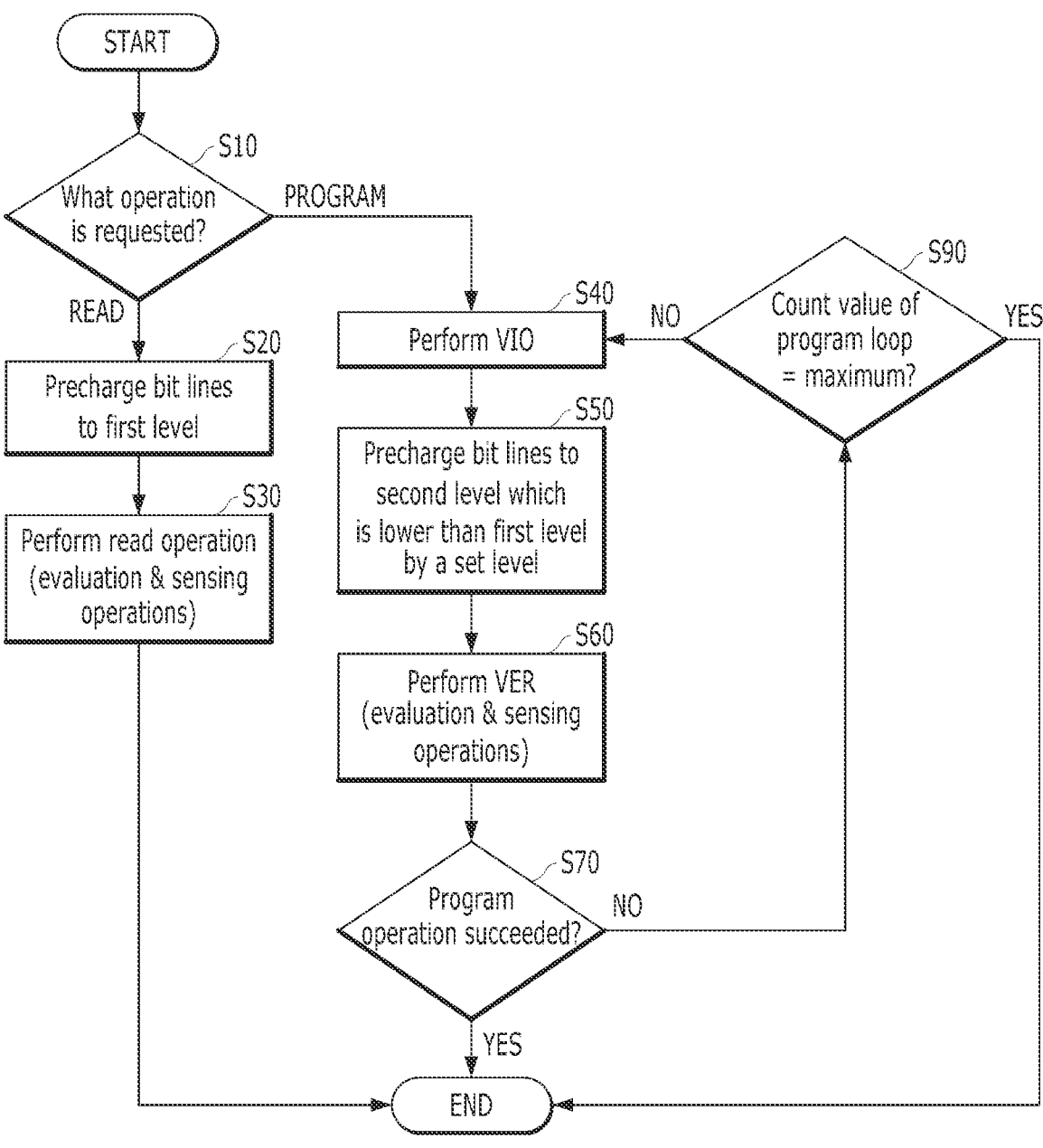
FIG. 8 is a flowchart describing an order of a read operation and a program operation performed in the memory device shown in FIG. 1 in accordance with an embodiment of the present invention.

FIG. 8 is a flowchart describing an order of a read operation and a program operation performed in the memory device shown in FIG. 1 in accordance with an embodiment of the present invention.

Referring to FIG. 8, it is possible to detect an operation requested for the selected memory cells of the memory cell array 201 in response to a command CMD and an address ADDR applied from the outside in operation S10.

When the detected operation is a read operation ("READ" at the operation S10), the bit lines BL<1:m> may be precharged to the first level LV1 in operation S20.

In operation S30, a read operation including an evaluation operation EVALUATION and a sensing operation SENSING may be performed for the bit lines BL<1:m> precharged to the first level through the operation S20.

When the detected operation is a program operation ("PROGRAM" at the operation S10), a voltage application operation VIO included in a first program loop PL1 among the program loops PL1 to PL7 may be performed in operation S40.

After the operation S40, the bit lines BL<1:m> may be precharged to the second level LV2 which is lower than the first level LV1 by the set level PDLV in operation S50. When the operation S50 is performed, the set level PDLV may be adjusted according to the physical position of the program word line. Also, when the operation S50 is performed, the set level PDLV may be adjusted according to the number of repetitions of the program loop.

In operation S60, a verify operation VER including an evaluation operation and a sensing operation may be performed. When the operation S60 is performed, the level of the verification voltage VRY<1:7> applied to the program word line may be adjusted in proportion to the set level PDLV adjusted in the operation S50.

After the operation S60, it may be checked whether the program operation is successful or not in operation S70. When the program operation is performed successfully in the operation S70 (YES at the operation S70), the program operation may be determined to be successful and then terminated. When the program operation is not successful in the operation S70 (NO at the operation S70), the count value of the program loop may be increased in operation S80. Herein, when the program operation is not successful in the first program loop PL1, the count value of the program loop may be increased from the first program loop PL1 to the second program loop PL2 through the operation S80.

After the operation S80, it may be checked whether the count value of the program loop is the maximum program loop count value or not in operation S90. When the count value of the program loop is the maximum program loop count value in the operation S90 (YES at the operation S90), the program operation may be determined to be a failure and then terminated.

In the operation S90, when the count value of the program loop is less than the maximum program loop count value (NO at the operation S90), the operations S40, S50, S60, S70, S80, and S90 may be sequentially performed again.

According to an embodiment of the present invention, the level of a precharge voltage used in a bit line precharge operation of a verify operation may be set to be lower than the level of a precharge voltage used in a bit line precharge operation of a read operation included in a program operation by a predetermined level.

Also, according to an embodiment of the present invention, the level that is set according to the physical position of a word line which is selected as a program target may be adjusted.

Also, according to an embodiment of the present invention, the set level may be adjusted according to the number of repetitions of a program loop.

As a result, reliability of a program operation may be improved.

While the present invention has been described with respect to the specific embodiments, it will be apparent to those skilled in the art that various changes and modifications may be made without departing from the spirit and scope of the invention as defined in the following claims. Furthermore, the embodiments may be combined to form additional embodiments.

What is claimed is:

1. A memory device, comprising:
a memory cell array including a plurality of memory cell strings, and coupled between a plurality of bit lines and a plurality of word lines, the bit lines commonly coupled to a common source line; and
a control portion suitable for: precharging the bit lines to a first level during a read operation for selected memory cells coupled to a selected word line of the word lines, and
precharging the bit lines to a second level during a verify operation of a program operation for the selected memory cells,
performing the program operation by repeating a program loop including a voltage application operation and the verify operation until the program operation is performed successfully, and
wherein the second level is lower than the first level by a set level, and
wherein the control portion adjusts the set level further according to a number of repetitions of the program loop.

2. The memory device of claim 1, wherein the control portion is further suitable for adjusting the set level according to a physical position of the selected word line during the verify operation.

3. The memory device of claim 2, wherein the control portion adjusts the set level by increasing the set level as the selected word line is positioned closer to the common source line.

4. The memory device of claim 2, wherein the control portion adjusts the set level by increasing the set level in proportion to the number of repetitions.

5. The memory device of claim 2, wherein the control portion is further suitable for increasing, in proportion to an increase in the set level, a level of a verification voltage applied to the selected word line during the verify operation.

6. The memory device of claim 1, wherein the control portion includes a precharge control unit suitable for precharging the bit lines to one level among the first level and the second level.

7. The memory device of claim 6, wherein the precharge control unit precharges the bit lines to:
the first level during the read operation, and
the second level during the verify operation.

8. The memory device of claim 7,
wherein the control portion further includes a positioning unit suitable for detecting a physical position of the selected word line, and
wherein the precharge control unit is further suitable for adjusting the set level according to the physical position during the verify operation.

9. The memory device of claim 8, wherein the precharge control unit adjusts the set level by increasing the set level as the selected word line is positioned closer to the common source line.

10. The memory device of claim 8,
wherein the control portion further includes a program operating unit suitable for performing the program operation by repeating the program loop including the voltage application operation and the verify operation until the program operation is performed successfully, and
wherein the precharge control unit adjusts the set level further according to a number of repetitions of the program loop.

11. The memory device of claim 10, wherein the precharge control unit adjusts the set level by increasing the set level in proportion to the number of repetitions.

12. The memory device of claim 10, wherein the program operating unit is further suitable for increasing, in proportion to an increase in the set level, a level of a verification voltage applied to the selected word line during the verify operation.

13. A method for operating a memory device including a memory cell array having a plurality of memory cell strings, and coupled between a plurality of bit lines and a plurality of word lines, the method comprising:

precharging the bit lines to a first level during a read operation for selected memory cells included in cell strings coupled to a selected word line of the word lines; and precharging the bit lines to a second level during a verify operation of a program operation for the selected memory cells, performing the program operation by repeating a program loop including a voltage application operation and the verify operation until the program operation is performed successfully, and wherein the second level is lower than the first level by a set level, and wherein the set level is adjusted further according to a number of repetitions of the program loop.

14. The method of claim 13, further comprising adjusting the set level according to a physical position of the selected word line during the verify operation.

15. The method of claim 14, wherein the adjusting includes increasing the set level as the selected word line is positioned closer to the common source line.

16. The method of claim 14, wherein the adjusting includes increasing the set level in proportion to the number of repetitions.

17. The method of claim 14, further comprising increasing, in proportion to an increase in the set level, a level of a verification voltage applied to the selected word line during the verify operation.

18. An operating method of a memory device, the operating method comprising:

lowering, during a verify operation in a program operation on a row of memory cells, a precharge level of bit lines by an amount from the precharge level for a read operation on the row;

increasing the amount as the row is disposed closer to a common source line and as a number of program loops increases during the program operation; and increasing, in proportion to the amount, a level of a verification voltage applied to the row.

* * * * *